United States Patent
Nowak et al.

(10) Patent No.: US 7,375,000 B2
(45) Date of Patent: May 20, 2008

(54) DISCRETE ON-CHIP SOI RESISTORS

(75) Inventors: Edward J. Nowak, Essex Junction, VT (US); Richard Q. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 248 days.

(21) Appl. No.: 11/161,911

(22) Filed: Aug. 22, 2005

(65) Prior Publication Data

US 2007/0040236 A1 Feb. 22, 2007

(51) Int. Cl.
*H01L 21/20* (2006.01)

(52) U.S. Cl. .............................. 438/382; 257/E21.363; 257/E27.047; 257/E21.022; 257/E21.016

(58) Field of Classification Search ................ 438/382; 257/E21.363, E21.022, E21.016, E27.047
See application file for complete search history.

(56) References Cited

U.S. PATENT DOCUMENTS

| | | | |
|---|---|---|---|
| 4,637,125 A * | 1/1987 | Iwasaki et al. ............. 438/203 |
| 5,864,162 A | 1/1999 | Reedy et al. | |
| 6,074,899 A | 6/2000 | Voldman | |
| 6,124,615 A | 9/2000 | Lee | |
| 6,720,621 B1 | 4/2004 | Adan | |
| 7,235,468 B1 * | 6/2007 | Mouli ........................ 438/514 |
| 2002/0089004 A1 * | 7/2002 | Rhodes ....................... 257/290 |
| 2003/0209780 A1 | 11/2003 | Burr | |
| 2003/0234438 A1 * | 12/2003 | Huang et al. ............... 257/547 |
| 2004/0065925 A1 * | 4/2004 | Bhattacharyya ............. 257/359 |
| 2004/0132234 A1 | 7/2004 | Ko et al. | |

* cited by examiner

*Primary Examiner*—Michael S. Lebentritt
*Assistant Examiner*—Thu-Huong Dinh
(74) *Attorney, Agent, or Firm*—Law Office of Charles W. Peterson, Jr.; Anthony Canale (57) ABSTRACT

A semiconductor resistor, method of making the resistor and method of making an IC including resistors. Buried wells are formed in the silicon substrate of a silicon on insulator (SOI) wafer. At least one trench is formed in the buried wells. Resistors are formed along the sidewalls of the trench and, where multiple trenches form pillars, in the pillars between the trenches by doping the sidewalls with an angled implant. Resistor contacts are formed to the buried well at opposite ends of the trenches and pillars, if any.

15 Claims, 6 Drawing Sheets

DISCRETE ON-CHIP SOI RESISTORS

BACKGROUND OF THE INVENTION

1. Field of the Invention

The present invention is related to on-chip resistors for Integrated Circuit (IC) chips and more particularly to on-chip discrete resistors in Ultra-Thin SOI (UTSOI) ICs.

2. Background Description

Integrated Circuits (ICs) are commonly made in the well-known complementary insulated gate Field Effect Transistor (FET) technology known as CMOS. Typical high performance ICs include CMOS devices (FETs) formed in a number of stacked layers (e.g., wiring, via, gate and gate dielectric) on a surface semiconductor (silicon) layer of a Silicon On Insulator (SOI) chip or wafer. CMOS technology and chip manufacturing advances have resulted in a steady decrease of chip feature size to increase on-chip circuit switching frequency (circuit performance) and the number of transistors (circuit density). In what is typically referred to as scaling, device or FET features are reduced to shrink corresponding device minimum dimensions, including both horizontal dimensions (e.g., minimum channel length) and vertical dimensions, e.g., channel layer depth, gate dielectric thickness, junction depths and etc. Shrinking device size increases device density and improves circuit performance (both from increased device drive capability and decreased capacitive load). Scaling also entails thinning the surface device layer to control device threshold roll off. Especially in Ultra-Thin SOI (UTSOI), thinning the surface device layer has resulted in devices with fully-depleted bodies (i.e., in what is known as Fully-Depleted SOI or FD-SOI). Scaled FD-SOI devices can have substantially higher series resistance, as well as substantially higher capacitance in some aspects.

Frequently, a circuit requires a fixed resistance. Doped semiconductor, typically, has a relatively well-defined sheet resistance ($\rho$). The sheet resistance of a particular layer is given as a number of ohms per square ($\Omega/$) that depends upon dopant concentration and layer depth. So, normally, CMOS resistors are formed by defining doped region in a chip surface or surface layer, e.g., a doped rectangle in the silicon surface layer of a SOI chip with contacts at opposite ends. The resistance for such a resistor can be determined by dividing the distance between the contacts (length) by the other rectangle dimension (width) to arrive at the number of squares and multiplying that number by the sheet resistance. Unfortunately, with the thinner layers in UTSOI, sheet resistance varies with electrical field in doped semiconductors, whether doped polysilicon or doped surface layer.

While for thicker surface layers this variation had been neglectable, UTSOI surface layers may be so thin and the sheet resistance may be so high, that a voltage on an adjacent conducting layer fully depletes the surface layer shape intended to act as resistor. Thus, although a doped silicon structure may be a planar resistor by design, it may be voltage varying or naturally free of mobile charge due to low dopant charge and surrounding built-in fields. This is because the front or top gate workfunction (from overlying structures) and the back gate (substrate) workfunction, the thinness of the channel, and the dopant limits on the thin resistor body channel, may combine to fully deplete the channel (resistor body under the gate) of mobile charge. So, the workfunction of adjacent structures to a planar resistor creates electric fields such that the planar resistor is fully-depleted even under normal bias conditions and, therefore, very high resistance.

Consequently, depending upon placement with other circuit shapes such a doped silicon shape may have a time varying (and unpredictable) resistance and under some circumstances (e.g., a doped silicon surface layer shape that is biased by adjacent bulk silicon), be so high as to act as an open circuit. Moreover, the above mentioned combination of dopant solid solubility limits and low volume may result in unusably high resistance even in moderately to highly doped regions of the UTSOI surface layer.

Thus, there is a need for well behaved on-chip resistors in UTSOI with well-defined resistance that is not voltage or time varying.

SUMMARY OF THE INVENTION

It is a purpose of the invention to reduce voltage sensitivity for on-chip resistors;

It is another purpose of the invention to reduce voltage sensitivity for discrete on-chip resistors in UTSOI CMOS circuits;

It is yet another purpose of the invention to produce discrete on-chip resistors in UTSOI CMOS circuits that are substantially voltage insensitive and immune to the effects of full depletion.

The present invention relates to a semiconductor resistor, method of making the resistor and method of making an IC including resistors. Buried wells are formed in the silicon substrate of a silicon on insulator (SOI) wafer. At least one trench is formed in the buried wells. Resistors are formed along the sidewalls of the trench and, where multiple trenches form pillars, in the pillars between the trenches by doping the sidewalls with an angled implant. Resistor contacts are formed to the buried well at opposite ends of the trenches and pillars, if any.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1A:
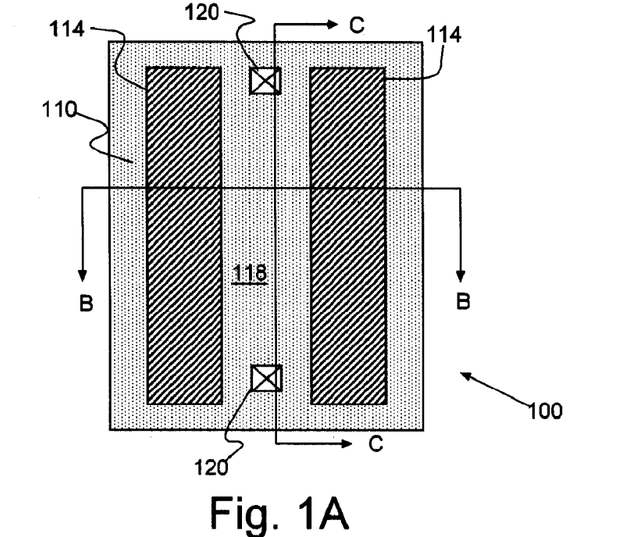
FIGS. 1A-C show a first example of a discrete resistor in Ultra-Thin semiconductor (e.g., Silicon) On Insulator (UTSOI) according to a preferred embodiment of the present invention.
Figure 1B:
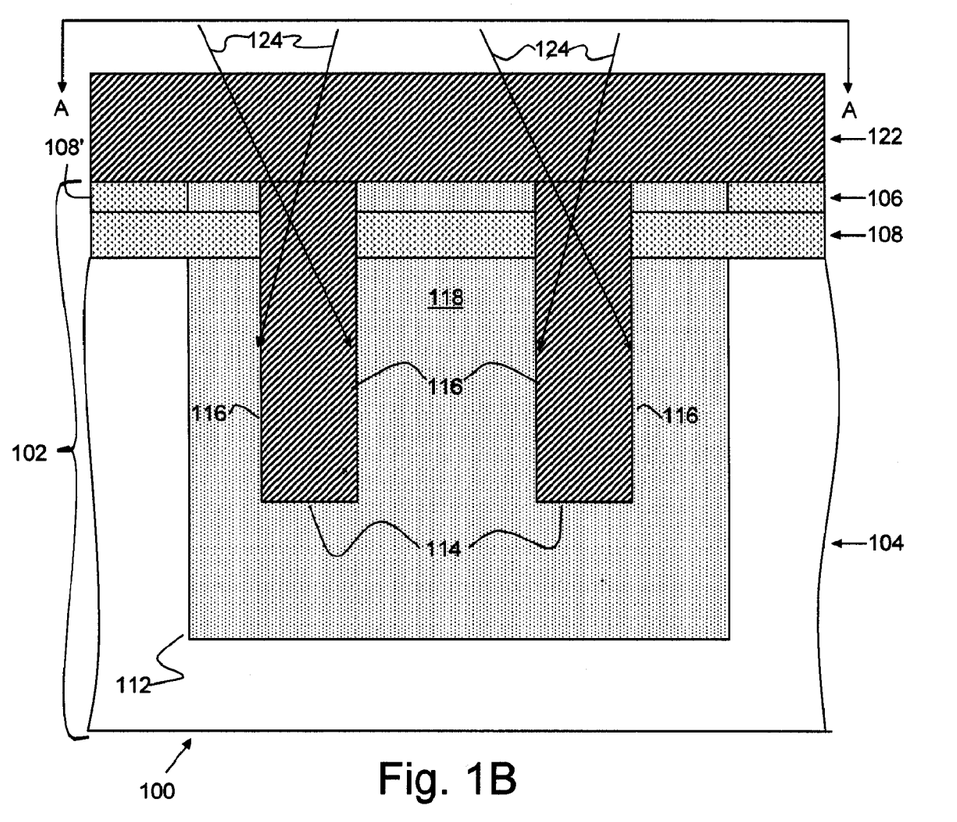
Figure 1C:
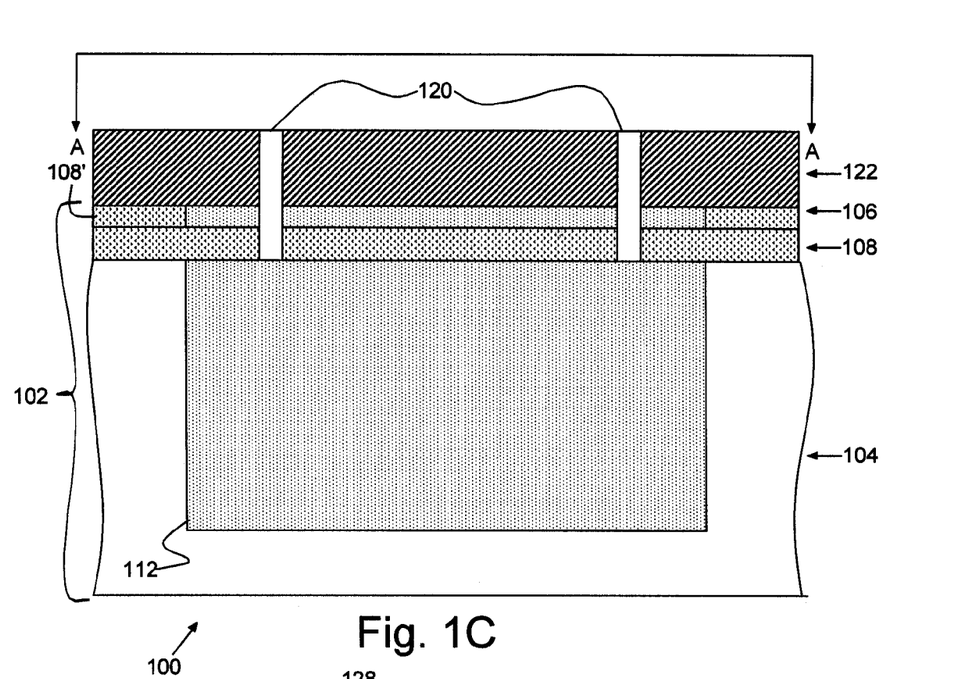

Turning now to the drawings and, more particularly, FIGS. 1A-C show a first example of a discrete resistor 100 in Ultra-Thin semiconductor (e.g., Silicon) On Insulator (UTSOI), according to a preferred embodiment of the present invention. FIG. 1A shows a plan view, FIG. 1B shows a cross sectional view through B-B, and FIG. 5C shows a cross sectional view through C-C. In particular, the preferred resistor 100 is formed through the surface of a UTSOI wafer 102 that includes a bulk silicon layer or silicon substrate 104 and ultra-thin surface layer 106 separated by a dielectric layer 108, a buried oxide (BOX) layer in this example. An island 110 defined in the ultra-thin surface layer 106 defines the location of each resistor 100. Islands 110 may be defined, for example, etching trenches through the ultra-thin surface layer 106 for shallow trench isolation (STI) and filling the shallow trenches with insulating material 108', e.g., oxide. Also, each island 110 may define an optional buried well 112 immediately below the island 110 in the substrate 104, e.g., a buried N-well 112 in a P-doped substrate 104. Each optional buried well 112 serves to further isolate the resistor 100 from surrounding structures, e.g., other resistors 100 in the same Integrated Circuit (IC) chip. Preferably, however, one or more orifices 114, 2 deep trenches in this example, extend through the ultra-thin silicon surface layer 106, dielectric layer 108 and into the buried well 112. Preferably, however, the resistors 100 are formed without the buried wells 112 and the trenches 114 are formed into the substrate 104. Trench sidewalls 116 are heavily doped opposite that of the substrate 104, such that the sidewalls 116 are resistive with resistive pillars 118 forming between adjacent trenches 114. Since the trench sidewalls 116 are resistive, the doped surface (i.e., trench sidewalls 116) far exceeds the trench surface area 114, e.g., in the plan view of FIG. 1A. Resistor contacts 120 at either end of the pillar 118 extend through the ultra-thin silicon surface layer 106 and dielectric layer 108 to the buried well 112. For a single such trench 114, the number of squares may be approximated by dividing the resistor length (the distance between the contacts 120) by the width, i.e., the width of the trench plus twice its depth. Resistor 100 is isolated from other structures (not shown) by a surface dielectric layer 122. Chip wiring connections to resistor contacts 120 connect resistors to other chip circuit elements, e.g., FETs and capacitors, also not shown.

Figure 2:
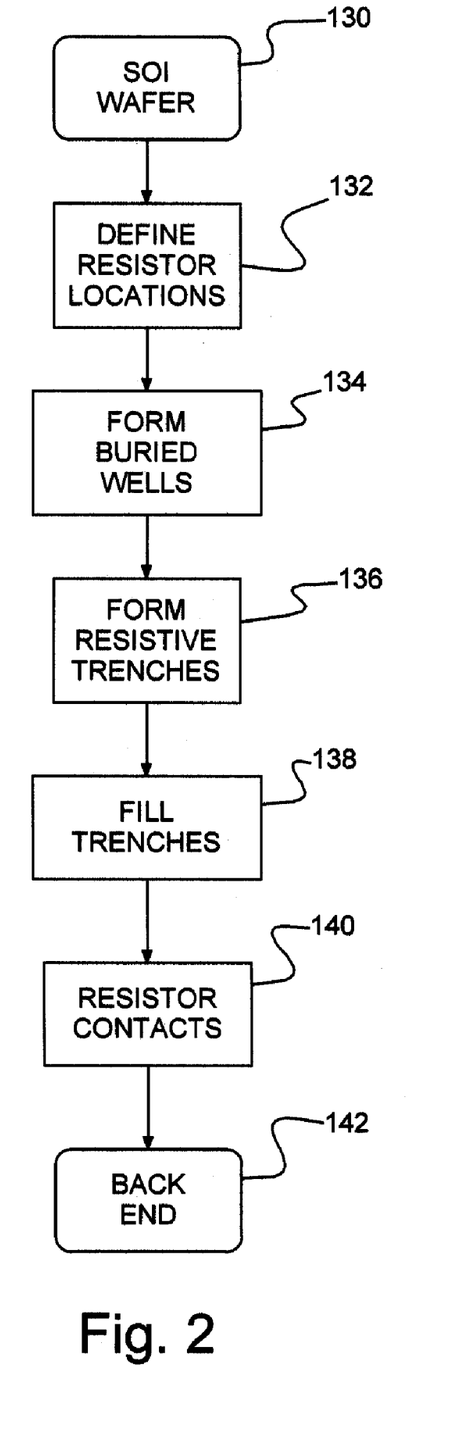
FIG. 2 shows an example of steps in forming preferred resistors.

FIG. 2 shows an example of steps in forming preferred resistors, e.g., 100 in FIGS. 1A-C on chip sites of a typical UTSOI wafer. Although shown herein for UTSOI, this is for example only. Resistors formed according to the present invention may be formed in any suitable technology. Preferably, the resistors 100 are formed coincident with forming circuit devices (not shown) in the surface silicon layer 106, with appropriate device formation steps being carried out at each of, or between, the resistor definition steps. However, preferred resistors may be completely defined and formed prior to, or subsequent to defining and forming circuit devices in the surface silicon layer 106. Resistor formation begins with a semiconductor wafer in step 130, preferably a UTSOI wafer. Then, the surface of the wafer is masked in step 132 to define resistor locations (e.g., 100 in FIGS. 1A-C) and, optionally, active device areas. Preferably, resistor locations 100 are defined using typical STI techniques, i.e., photolithographically patterning shallow trenches in silicon layer 106 to define islands 110, and then, forming insulator 108' in the shallow trenches. Thus, resistor location 100 definition may be coincident with normal shallow trench definition for device isolation, for example.

Optionally, in step 134 buried wells 112 may be formed at resistor locations, e.g., implanting dopant through the islands 110 and into the substrate 104 and diffusing to form the buried wells 112. N-type or P-type wells are formed depending upon, and opposite from, the selected substrate 104 and dopant type, to form an isolating junction with the substrate. Also, in one preferred embodiment as set forth hereinbelow, the buried well may be a multi-well defined in the substrate 104. Resistive trench formation begins in step 136, by opening deep trenches 114 through the islands 110, underlying insulator 108 and into substrate 104, or if included, the buried wells 112. So, for example, deep trenches 114 are formed in the resistor locations 100, extending into the buried well 112, preferably, 0.1-1.0 μm, depending upon desired resistance. Next, using an angled implant a dopant of a type opposite that of the substrate 104 is implanted into trench sidewalls 116, represented by arrows 124 in FIG. 1B. Preferably, the deep trench mask (not shown) serves as the dopant mask. After doping the trench sidewalls 116, the dopant mask is removed. Then, a typical wafer anneal out-diffuses implanted dopant from the sidewalls 116 with resistive pillars 118 forming between pairs of trenches 114. Alternately, optional step 134 of forming buried wells 112 may be done coincidentally with step 136, with the buried wells 112 being formed as the trench sidewalls 116 are doped and diffused.

Trench sidewalls 116 are heavily doped with the same type dopant as the doped well (e.g., to a dopant concentration of $10^{15}$-$10^{21}$ cm$^{-3}$), such that the sidewalls 116 are resistive. Thereafter, in a typical dopant diffusion step (e.g., with source/drain diffusion), dopant is diffused into the sidewalls 116 and especially into the pillar 118 between the trenches 114. Preferably, the dopant outdiffuses from the sidewalls 116 to merge between trenches 114 with pillars 118 being resistive.

Next, in step 138 the trenches 114 are filled with a dielectric 114, e.g., filling with TetraEthOxySilane (TEOS) or any other suitable dielectric, using Plasma Enhanced Chemical Vapor Deposition (PECVD), for example. Then, excess fill material may be removed by planarizing the wafer to the ultra-thin surface layer 106, e.g., using chemical-mechanical (chem-mech) polishing. Once the ultra-thin surface layer 106 has been re-exposed, devices are formed on neighboring chip islands, using typical device formation steps. The surface dielectric 122 represents one or more dielectric layers that separate subsequently formed wiring layers (not shown) that are formed on the wafer surface over the newly formed devices and resistors. In step 140 resistor contacts 120 are formed for subsequently formed wiring layers using typical contact formation steps. So, for example, contacts 120 may be formed by masking the wafer, photolithographically and directionally etching contact openings to the substrate 104 or optional buried well 112, using an etchant that is non-selective to the surface dielectric 122, ultra-thin silicon island 110 and BOX layer 108. Alternately, separate selective etches may be used to etch each of the contact openings through each of the layers 122, 110 and 108. After etching contact openings to the substrate 104, the openings are filled with suitable contact material, e.g. metal, and surface contact material is cleared away, e.g., using a chem-mech polish. Thereafter, in step 142, chip formation proceeds normally, connecting devices and resistors into circuits and creating off chip terminals. Resistors 100 may be used, for example, as gain resistors in an operational amplifier for on-chip analog amplification in UTSOI.

Figure 3:
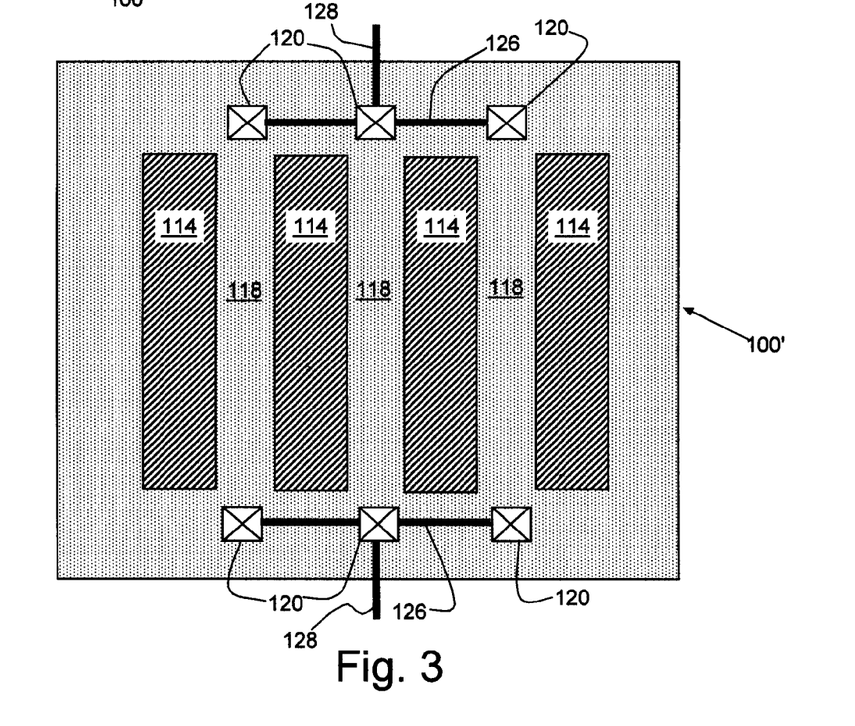
FIG. 3 shows a multi-pillar example resistor.

FIG. 3 shows a multi-pillar 118 example resistor 100', substantially similar to the example of FIGS. 1A-C with like elements labeled identically. In this example, 3 identical pillars 118 are connected in parallel by local wires 126 and connected to other circuit elements by wires 128. It should be noted that, although resistor examples are shown herein formed with 1 and 3 pillars 118, this is for example only and not intended as a limitation. The number of pillars 118 is selected for the desired resistance with respect to the per unit length of a pillar and the desired size of the resistor. Thus resistor resistance can be selected by extending trench length for longer pillars 118 for higher resistance or by providing parallel pillars for less.

Figure 4A:
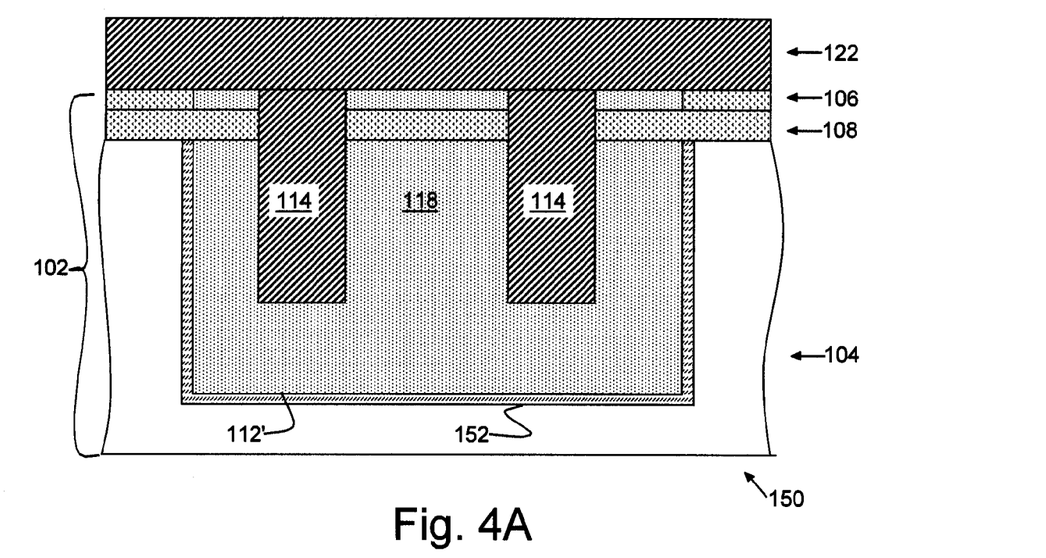
FIGS. 4A-B show multi-well examples of a second preferred embodiment UTSOI resistors formed in a layered multi-well.
Figure 4B:
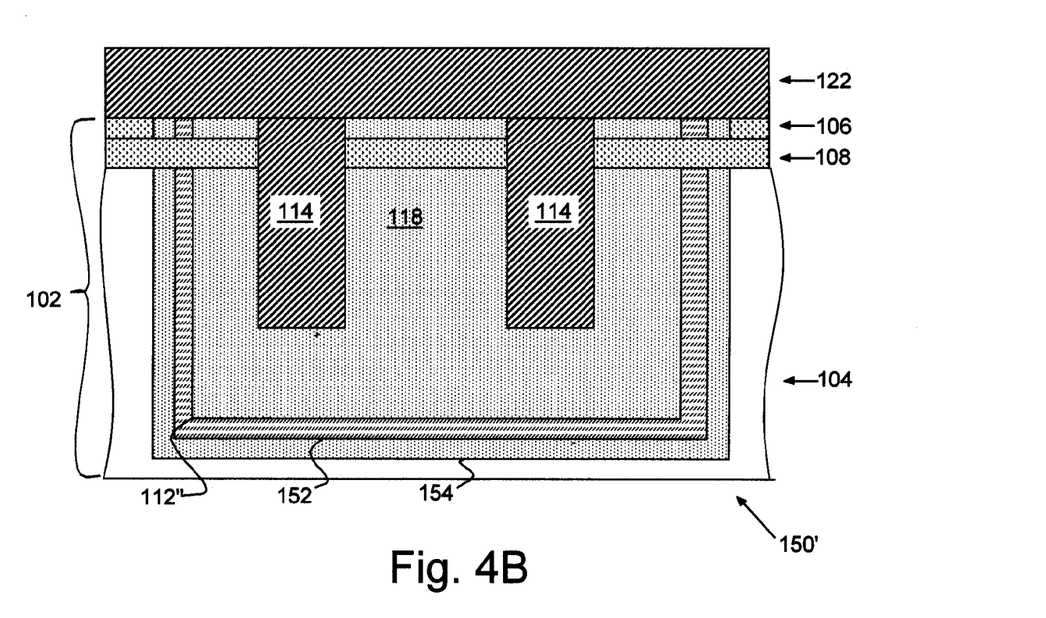

FIGS. 4A-B show multi-well examples of preferred embodiment UTSOI resistors formed in a layered multi-well, substantially similar to the UTSOI resistor 100 of FIGS. 1A-C with like features labeled identically. The multi-layered wells In the UTSOI resistor 150 example of FIG. 4A, a pair of wells 152 and 112' are formed in step 134 with appropriate well type selection, i.e., N-type diffusion in a P-well in an N-type substrate or P-type diffusion in a N-well in a P-type substrate. The UTSOI resistor 150' example of FIG. 4B is formed with an additional pair of alternating dopant type wells 152, 154, formed in step 134, again with appropriate well type selection. The additional wells, 152 or 152, 154 are implanted and diffused prior to implanting the resistor well 112', 112". For these multi-well examples, however, the additional well junctions form a series of back-to-back diode junctions, e.g., 104-152 and 152-112'; or 104-154, 154-152 and 152-112". The multiple well structures 150', 150" may be formed by spacing implant dopant peaks for each well, 152, 154, 112'/112". The resistor well 112' or 112" is separated from the substrate 104 by the additional wells 152, 154, e.g., to better isolate the particular resistor well 112' or 112" from noise originating at other resistors.

Figure 5:
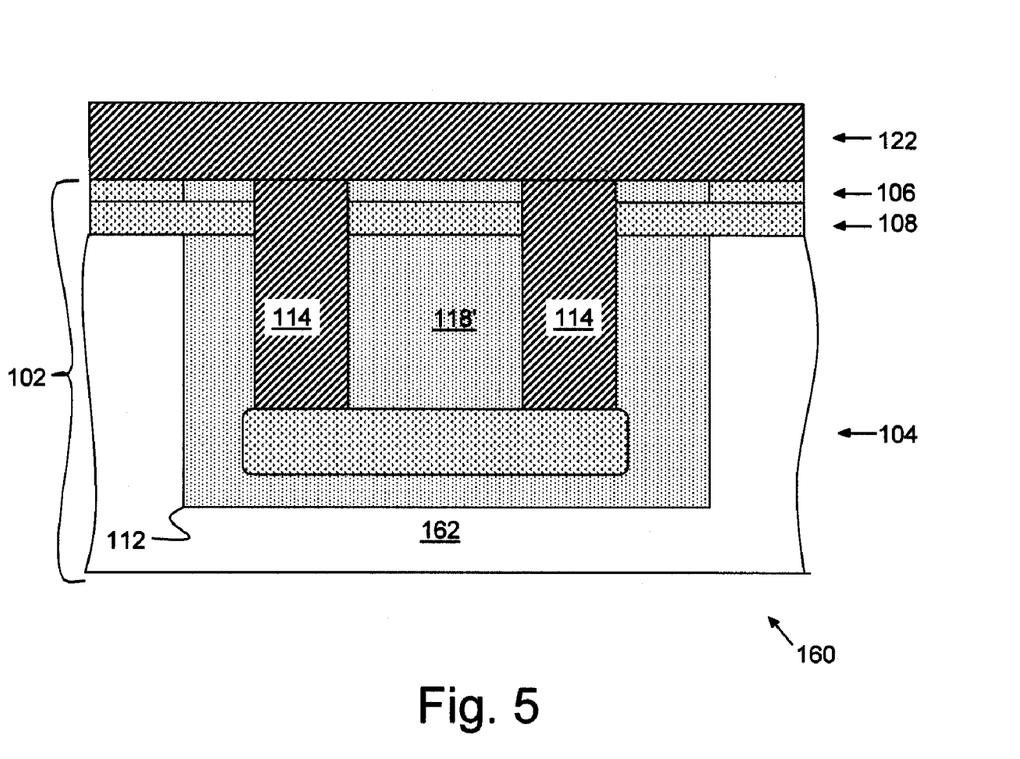
FIG. 5 shows another example of a preferred embodiment UTSOI resistor with a single well isolated by an embedded dielectric layer.

FIG. 5 shows another example of a preferred embodiment UTSOI resistor 160 with the pillar 118' isolated by an embedded dielectric layer 162 in the single well 112, substantially similar to the UTSOI resistor 100 of FIG. 1 with like features labeled identically. So, for further isolation in this example, the pillar 118' is partially isolated from the buried well 112 by the embedded dielectric layer 162. The embedded dielectric layer 162 may be formed by high-dose implanting oxygen into the substrate 104 and annealing the wafer before forming the wells 112 in step 134. Thus, this embodiment selectively has application in SIMOX-SOI technologies, for example. Further, although shown here for a single well UTSOI resistor 160, an underlying isolation structure also may be formed with multiple well UTSOI resistor, e.g., 150, 150'.

Figure 6A:
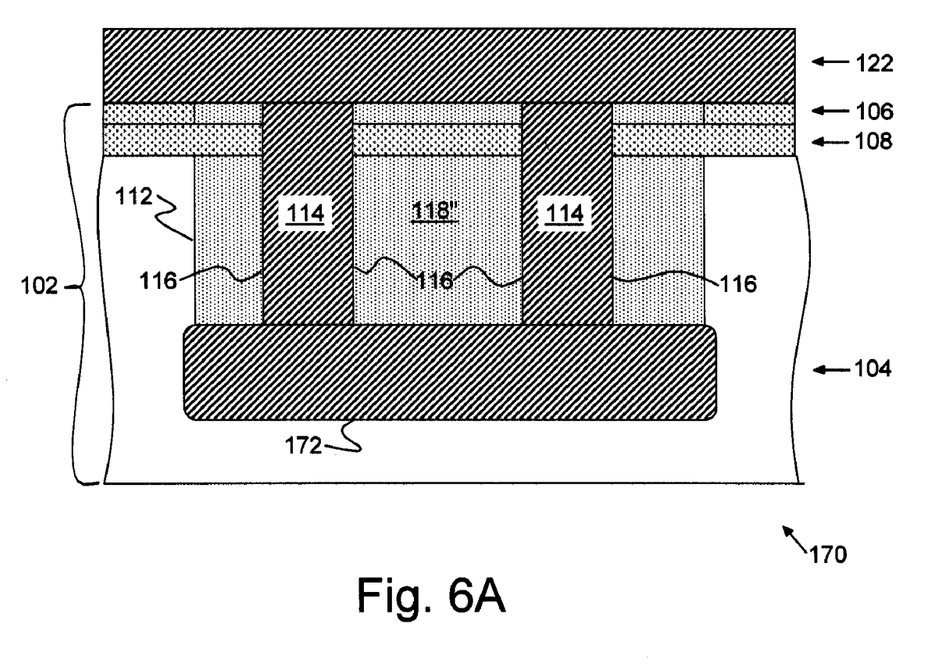
FIGS. 6A-B show variations on yet another example of a preferred embodiment UTSOI resistor with a single well.
Figure 6B:
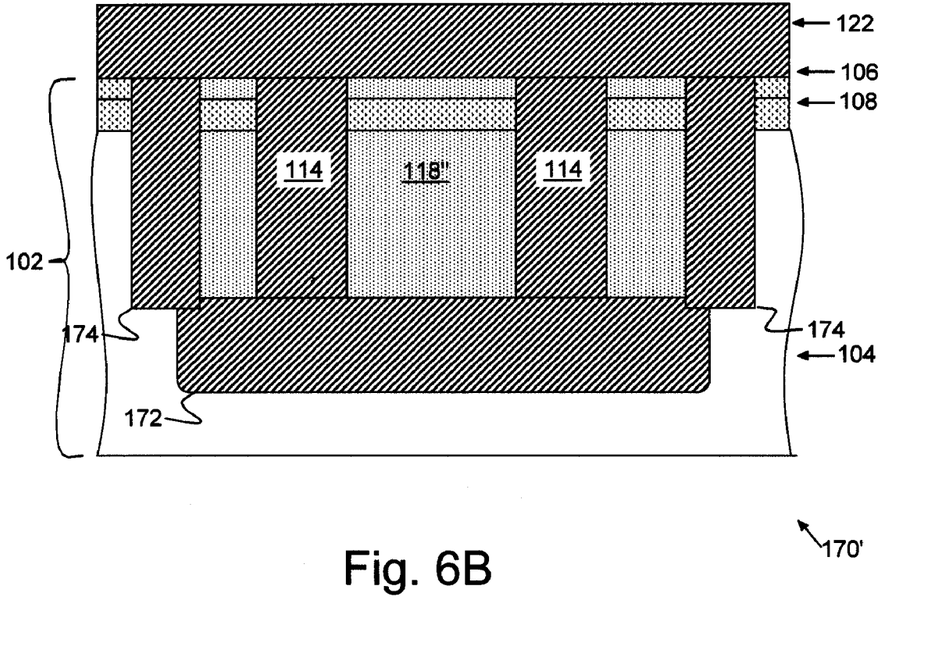

FIGS. 6A-B show variations on yet another example of a preferred embodiment UTSOI resistor 170, 170' with a single well 112, in this example, formed substantially identically to the UTSOI resistor 100 of FIG. 1 and further isolated by an underlying dielectric layer 172 and with like features labeled identically. In particular, the underlying dielectric layer 172 is formed after forming resistive trenches in step 136 and before filling the trenches in step 138. So, after doping the trench sidewalls 116 and with the dopant implant mask still present, thermal oxide is grown in the trenches, and the thermal oxide is isotropically etched. Isotropically etching removes the thermal oxide from the horizontal, bottom surface of the trenches 114, while oxide remains on the vertical sidewalls 116. Then, using a selective etchant suitable for etching silicon, the exposed trench floors are etched, undercutting the resistor pillars 118" until a cavern is formed beneath the pillars 118". The cavern is filled with dielectric as the trenches 114 are filled in step 138 to form the underlying dielectric layer 172, e.g., using thermal oxidation or depositing oxide in a suitable chemical vapor deposition.

In the example of FIG. 6B, deep trenches 174 are formed around the perimeter of the UTSOI resistor 170' for additional isolation. Outboard deep trenches 174 are formed, preferably, subsequent to filling trenches in step 130. Alternately, outboard deep trenches 174 are formed with trenches 114, e.g., using a block out mask when trenches 114 are doped, to avoid doping sidewalls of the outboard deep trenches 174. Also, outboard trenches 174 may be included with the above embodiments of FIGS. 1A-C, 4A-B and 5 for additional resistor isolation. Further, although shown here for a single well UTSOI resistor 160, an underlying isolation structure also may be formed with a multi-well UTSOI resistor, e.g., 150, 150'.

Advantageously, preferred embodiment discrete resistor are easily and seamlessly integrated in FET ICs and, in particular in UTSOI CMOS ICs. Further, resistance is easily selected and controlled in any state of the art SOI or UTSOI CMOS technology.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. A method of fabricating a resistor comprising:
   providing a layered wafer having a buried insulator layer separating a substrate from an active surface layer, said substrate and said active surface layer being of a first conductivity type;
   opening at least one orifice through said active surface layer and said buried insulator layer into said substrate; and
   doping a region of said substrate adjacent to each said at least one orifice to a second conductivity type, each doped said region providing a resistor at each doped said orifice.

2. A method of fabricating a resistor as in claim 1, wherein each said at least one orifice is a trench and said step of forming comprises:
   patterning a photoresist layer to form a mask on said layered wafer, said mask including at least one opening exposing portions of said active surface layer; and
   etching exposed said active surface layer, said buried insulator layer and said substrate through said at least one opening to form said trench.

3. A method of fabricating a resistor as in claim 2, wherein said step of doping comprises:
   implanting an impurity into sidewalls of each said trench; and
   outdiffusing said impurity into said region of said substrate adjacent to said each trench.

4. A method of fabricating a resistor as in claim 3, further comprising:
   filling said each wench with a dielectric.

5. A method of fabricating a resistor as in claim 2, wherein before the step of patterning the photoresist mask, said step of forming further comprises:
   defining at least one island in said active surface layer; and
   forming a well of said second conductivity type at ones of said at least one island, said well extending into said substrate, each said trench being formed in one said well.

6. A method of fabricating a resistor as in claim 5, wherein at least one trench is a plurality of trenches, said method further comprising:
   forming contacts at opposite ends of adjacent said trenches, each of said contacts extending through said active surface layer, said buried insulator layer and contacting said well at said substrate.

7. A method of forming integrated circuit (IC) chips, said method comprising the steps of:
   a) defining resistor locations in a silicon on insulator (SOI) wafer;
   b) forming resistive pillars into the buried well in each resistor location; and
   c) forming contacts at opposite ends of said resistive pillars.

8. A method of forming IC chips as in claim 7, wherein the step (a) of defining resistor locations comprises:
   patterning a surface layer of said SOI wafer, silicon islands being defined in said surface wafer.

9. A method of forming IC chips as in claim 8, wherein the step (b) of forming said resistive pillars into the buried wells in a substrate beneath said surface layer, a buried insulator layer separating said surface layer from said substrate.

10. A method of forming IC chips as in claim 9, wherein the step (c) of forming resistive pillars comprises:
   i) etching at least 2 trenches in each resistor location, each of said trenches extending through said surface layer, said oxide layer and into said substrate; and
   ii) doping sidewalls of said at least 2 trenches.

11. A method of forming IC chips as in claim 10, wherein the step (i) of etching said at least 2 trenches comprises etching trenches 0.-1.0 μm into said each buried well.

12. A method of forming IC chips as in claim 10, wherein the step (ii) of doping comprises implanting dopant into said sidewalls with an angled implant.

13. A method of forming IC chips as in claim 12, wherein the step (c) of forming resistive pillars further comprises the steps of:
   iii) etching the bottom of said at least 2 trenches to undercut said buried well; and
   iv) filling said undercut and said at least 2 trenches with dielectric material.

14. A method of forming IC chips as in claim 7, before the step (c) of forming resistive pillars, further comprising the steps of:
   c1) implanting oxygen into said buried well; and
   c2) annealing said SOI wafer in a high temperature anneal.

15. A method of forming IC chips as in claim 7, further comprising the step of:
   e) connecting said contacts to circuit wiring.

* * * * *